(12) United States Patent
Kwon et al.

(10) Patent No.: US 11,978,721 B2
(45) Date of Patent: *May 7, 2024

(54) ASIC PACKAGE WITH PHOTONICS AND VERTICAL POWER DELIVERY

(71) Applicant: Google LLC, Mountain View, CA (US)

(72) Inventors: Woon-Seong Kwon, Santa Clara, CA (US); Namhoon Kim, San Jose, CA (US); Teckgyu Kang, Saratoga, CA (US); Ryohei Urata, San Carlos, CA (US)

(73) Assignee: Google LLC, Mountain View, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/579,012

(22) Filed: Jan. 19, 2022

(65) Prior Publication Data

US 2022/0139876 A1 May 5, 2022

Related U.S. Application Data

(63) Continuation of application No. 16/567,766, filed on Sep. 11, 2019, now Pat. No. 11,264,358.

(51) Int. Cl.
*H01L 25/065* (2023.01)
*G02B 6/42* (2006.01)
(Continued)

(52) U.S. Cl.
CPC ........ *H01L 25/0652* (2013.01); *G02B 6/4257* (2013.01); *H01L 23/3121* (2013.01);
(Continued)

(58) Field of Classification Search
CPC . H01L 25/0652; H01L 25/167; H01L 25/075; H01L 25/041
See application file for complete search history.

(56) References Cited

U.S. PATENT DOCUMENTS 6,894,266 B2    5/2005  Richard et al.
10,505,509 B2 * 12/2019  Lakshmikumar ..... H03F 1/0233
(Continued)

FOREIGN PATENT DOCUMENTS

CN          1902751 A      1/2007
CN        106980159 A      7/2017
(Continued)

OTHER PUBLICATIONS

Office Action for Taiwanese Patent Application No. 109135652 dated Dec. 8, 2022. 8 pages.
(Continued)

*Primary Examiner* — Jarrett J Stark
(74) *Attorney, Agent, or Firm* — Lerner David LLP

(57) ABSTRACT

The technology relates to an integrated circuit (IC) package. The IC package may include a substrate. An IC die may be mounted to the substrate. One or more photonic modules may be attached to the substrate and one or more serializer/deserializer (SerDes) interfaces may connect the IC die to the one or more photonic modules. The IC die may be an application specific integrated circuit (ASIC) die and the one or more photonic modules may include a photonic integrated circuit (PIC) and fiber array. The one or more photonic modules may be mounted to one or more additional substrates which may be attached to the substrate via one or more sockets.

20 Claims, 7 Drawing Sheets

(51) Int. Cl.
| | |
|---|---|
| *H01L 23/31* | (2006.01) |
| *H01L 23/367* | (2006.01) |
| *H01L 23/498* | (2006.01) |
| *H01L 23/538* | (2006.01) |
| *H01L 25/16* | (2023.01) |
| *H01L 25/04* | (2023.01) |
| *H01L 25/075* | (2006.01) |
| *H01L 31/12* | (2006.01) |
| *H10K 39/00* | (2023.01) |

(52) U.S. Cl.
CPC .... *H01L 23/3672* (2013.01); *H01L 23/49805* (2013.01); *H01L 23/49811* (2013.01); *H01L 23/49816* (2013.01); *H01L 23/5385* (2013.01); *H01L 23/5386* (2013.01); *H01L 25/162* (2013.01); *H01L 25/041* (2013.01); *H01L 25/075* (2013.01); *H01L 25/167* (2013.01); *H01L 31/12* (2013.01); *H01L 2225/06517* (2013.01); *H10K 39/601* (2023.02)

(56) References Cited

U.S. PATENT DOCUMENTS

| | | | |
|---|---|---|---|
| 2003/0162386 A1 | 8/2003 | Ogawa et al. | |
| 2006/0113598 A1 | 6/2006 | Chen et al. | |
| 2008/0008477 A1 | 1/2008 | Ogawa | |
| 2009/0226130 A1 | 9/2009 | Doany et al. | |
| 2010/0006784 A1* | 1/2010 | Mack | G02B 6/43 250/551 |
| 2011/0206316 A1 | 8/2011 | Wang et al. | |
| 2012/0012990 A1 | 1/2012 | Pagaila et al. | |
| 2012/0032340 A1 | 2/2012 | Choi et al. | |
| 2012/0061814 A1 | 3/2012 | Camacho et al. | |
| 2014/0321804 A1 | 10/2014 | Thacker et al. | |
| 2015/0187608 A1 | 7/2015 | Ganesan et al. | |
| 2016/0190113 A1 | 6/2016 | Sharan et al. | |
| 2016/0314091 A1* | 10/2016 | Dutt | G11C 14/0018 |
| 2018/0052281 A1 | 2/2018 | Kuo et al. | |
| 2018/0196196 A1 | 7/2018 | Byrd et al. | |
| 2018/0299628 A1 | 10/2018 | Liu et al. | |
| 2019/0044002 A1 | 2/2019 | Byrd et al. | |
| 2019/0057940 A1 | 2/2019 | Cheah et al. | |
| 2019/0086618 A1 | 3/2019 | Shastri et al. | |
| 2019/0319160 A1* | 10/2019 | Riviere | G01S 17/04 |
| 2019/0335252 A1* | 10/2019 | Ryan | H04B 10/29 |
| 2019/0371781 A1 | 12/2019 | Huang et al. | |
| 2020/0037055 A1* | 1/2020 | Kucharewski | H04L 49/109 |
| 2020/0132930 A1* | 4/2020 | Bchir | G11C 7/1081 |
| 2020/0132946 A1* | 4/2020 | Bchir | G02B 6/421 |
| 2020/0204399 A1* | 6/2020 | Crayford | H04L 12/40045 |
| 2020/0273783 A1 | 8/2020 | Sankman et al. | |
| 2020/0286871 A1* | 9/2020 | Liff | H01L 21/4853 |

FOREIGN PATENT DOCUMENTS

| | | |
|---|---|---|
| CN | 107768303 A | 3/2018 |
| CN | 108735687 A | 11/2018 |
| CN | 109216315 A | 1/2019 |
| TW | 201519379 A | 5/2015 |
| TW | 201903449 A | 1/2019 |
| WO | 2017160284 A1 | 9/2017 |
| WO | 2018172484 A1 | 9/2018 |
| WO | 2019050477 A1 | 3/2019 |
| WO | 2019133019 A1 | 7/2019 |

OTHER PUBLICATIONS

Office Action for European Patent Application No. 20195513.5 dated Mar. 16, 2023. 8 pages.
Office Action for European Patent Application No. 20205957.2 dated Jul. 27, 2023. 5 pages.
Office Action for Chinese Patent Application No. 202010817738.2 dated Mar. 10, 2022. 5 pages.
Rockley Photonics Demonstrates In-Package Optics Platform to Select Partners, Aug. 15, 2019, six pages.
Light On Board Optical IC Package, Reflex Photonics, Aug. 15, 2019, two pages.
Office Action for Taiwanese Patent Application No. 109125385 dated Dec. 31, 2020. 5 pages.
Extended European Search Report for European Patent Application No. 20195513.5 dated Feb. 2, 2021. 10 pages.
Extended European Search Report for European Patent Application No. 20205957.2 dated May 10, 2021. 7 pages.
Liu. AVR Single Chip Microcomputer Principles and Measurement and Control Engineering Applications: Based on ATmega48/ATmega16. Jun. 30, 2015. Beihang University Press. 4 pages.
Li. Automotive Electrical and Electronic Technology. Sep. 30, 2016. Jiangsu Phoenix Science Press. 6 pages.
Notification of the First Office Action for Chinese Patent Application No. 202010817738.2 dated Aug. 3, 2021. 8 pages.
Office Action for Taiwanese Patent Application No. 109125385 dated Aug. 30, 2021. 5 pages.
Notice of Allowance with Search Report for Taiwanese Patent Application No. 111122711 dated Jul. 27, 2022. 5 pages.
Office Action for Chinese Patent Application No. 202011056882.5 dated Sep. 5, 2023. 6 pages.
Second Office Action for Chinese Patent Application No. 202011056882.5 dated Mar. 4, 2024. 5 pages.

* cited by examiner

ASIC PACKAGE WITH PHOTONICS AND VERTICAL POWER DELIVERY

CROSS REFERENCE TO RELATED APPLICATION

The present application is a continuation of U.S. patent application Ser. No. 16/567,766, filed on Sep. 11, 2019, the disclosure of which is hereby incorporated herein by reference.

BACKGROUND

Application specific integrated circuit packages which include one or more ASIC dies are becoming increasingly capable of processing at high speeds. As the processing speed ASIC dies continues to increase, input/output (I/O) systems which connect the ASIC package with other components may create a bottleneck. In this regard, the I/O systems may have insufficient bandwidth to handle the data throughput required by the ASIC die, thereby limiting the ASIC die from operating at its full potential.

SUMMARY

One aspect of the disclosure provides an integrated circuit (IC) package comprising a substrate, an IC die mounted to the substrate, one or more photonic modules attached to the substrate, and one or more serializer/deserializer (SerDes) interfaces connecting the IC die to the one or more photonic modules. The one or more SerDes interfaces may include a plurality of copper traces and the copper traces may be deposited on the substrate. In some instances, the IC die may be an application specific integrated circuit (ASIC) die. In some instances, the IC package may be configured to connect to a land grid array (LGA) socket. Power may be delivered to the IC package via the LGA socket.

In some instances, the one or more photonic modules may include a controller. The controller may manage transmission of data between its respective photonic module and the IC die. Each of the one or more photonic modules may further include a photonic integrated circuit (PIC) and fiber array. Each of the one or more SerDes interfaces may include a first side connected to a respective photonic module and a second, opposite side connected to the IC die. In some examples, the one or more photonic modules may be mounted to one or more additional substrates and the one or more additional substrates may be attached to the substrate via one or more sockets.

Another aspect of the disclosure provides an application specific integrated circuit (ASIC) package comprising a substrate, an ASIC die mounted to the substrate, one or more photonic modules attached to the substrate; one or more serializer/deserializer (SerDes) interfaces connecting the ASIC die to the one or more photonic modules, and a voltage regulator. In some instances, the voltage regulator may be mounted to the opposite side of the substrate where the ASIC die is mounted. The one or more SerDes interfaces may include a plurality of copper traces and the copper traces may be deposited on the substrate. In some examples, the substrate may be configured to connect to a land grid array (LGA) socket and power may be delivered to the voltage regulator via the LGA socket.

In some instances, each of the one or more photonic modules in the ASIC package may include a controller that manages transmission of data between its respective photonic module and the ASIC die. Each of the one or more photonic modules may further include a photonic integrated circuit (PIC) and fiber array. The one or more SerDes interfaces may include a first side and a second, opposite side, wherein for each of the SerDes interfaces, the first side connects to a respective photonic module and the second, opposite side connects to the ASIC die. The one or more photonic modules may be mounted to one or more additional substrates and wherein the one or more additional substrates may be attached to the substrate via one or more sockets.

DETAILED DESCRIPTION

The technology relates generally to an application specific integrated circuit (ASIC) package having an integrated photonic module and vertically integrated power regulator. As previously described, I/O systems which connect an ASIC package with other components may have insufficient bandwidth to handle the data throughput required by the ASIC die. To address this issue, I/O systems having bandwidths of around 100 Gbps may be used to reduce I/O system bottlenecks. However, these I/O system are typically connected via an external connection to the ASIC package via interfaces. As the bandwidth of the interfaces are increased to handle the throughput of the I/O system and, the traces of the interfaces, which carry the signals between the I/O system and ASIC die, may cause signal loss such as through high-frequency roll-off. The signal loss may be exacerbated by the length of the traces of the interfaces from the ASIC die to the externally located I/O system.

To reduce the amount of signal loss over an interface, the substrates through which the traces of the interface travel may be made from materials having low dielectric constants (Dk) and dielectric losses (Df). Moreover, the roughness of the surface of the traces may be reduced to further limit the amount of signal loss. However, even with the use of low Dk and Df materials, and smoothed traces, only marginal improvements to the amount of signal loss may be realized.

To remove or further remediate the issue of signal loss, I/O systems including photonic modules, may be integrated into the ASIC package. By integrating the photonic modules, the length of the traces connecting the photonic modules to the ASIC die may be reduced, thereby minimizing the amount of signal loss. In this regard, the length of the traces of the interfaces may be integrated into a low Dk and Df PCB. The traces which may connect the ASIC die to an external I/O system, may be around 10 inches. During operation at 100 Gbps, the 10 inch traces may experience a signal loss of around 20 dB.

Figure 1:
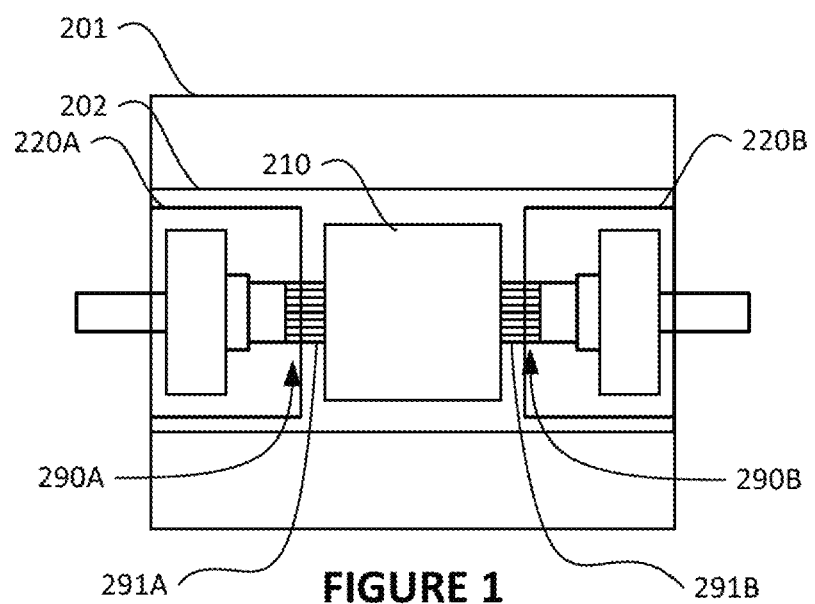
FIG. 1 is a top-down view of an ASIC packing with an integrated I/O interface in accordance with aspects of the disclosure.

By integrating the photonic modules into the ASIC package and attaching the photonic modules 220A and 220B to the same substrate as the ASIC die 221, as shown in the top-down cutaway view of ASIC package 201 in FIG. 1, the length of the traces 291A and 292B may be reduced. In this regard, the traces 291A and 291B in the interfaces from the ASIC die 210 to the integrated photonics modules 220A and 220B may be reduced to around 40-50 mm. Thus, at operating speeds of 100 Gbps, the amount of signal loss may be reduced by around 10 dB, relative to the signal loss over interfaces connecting an ASIC die with an I/O system outside of the ASIC package. As such, the PCB into which the traces of the interface are integrated may have higher Dk and Df values, which may save material costs, production costs, and while still providing improved signal transmission. These benefits may continue to be realized at even higher operating speeds, such as 200 Gbps or more.

Figure 2:
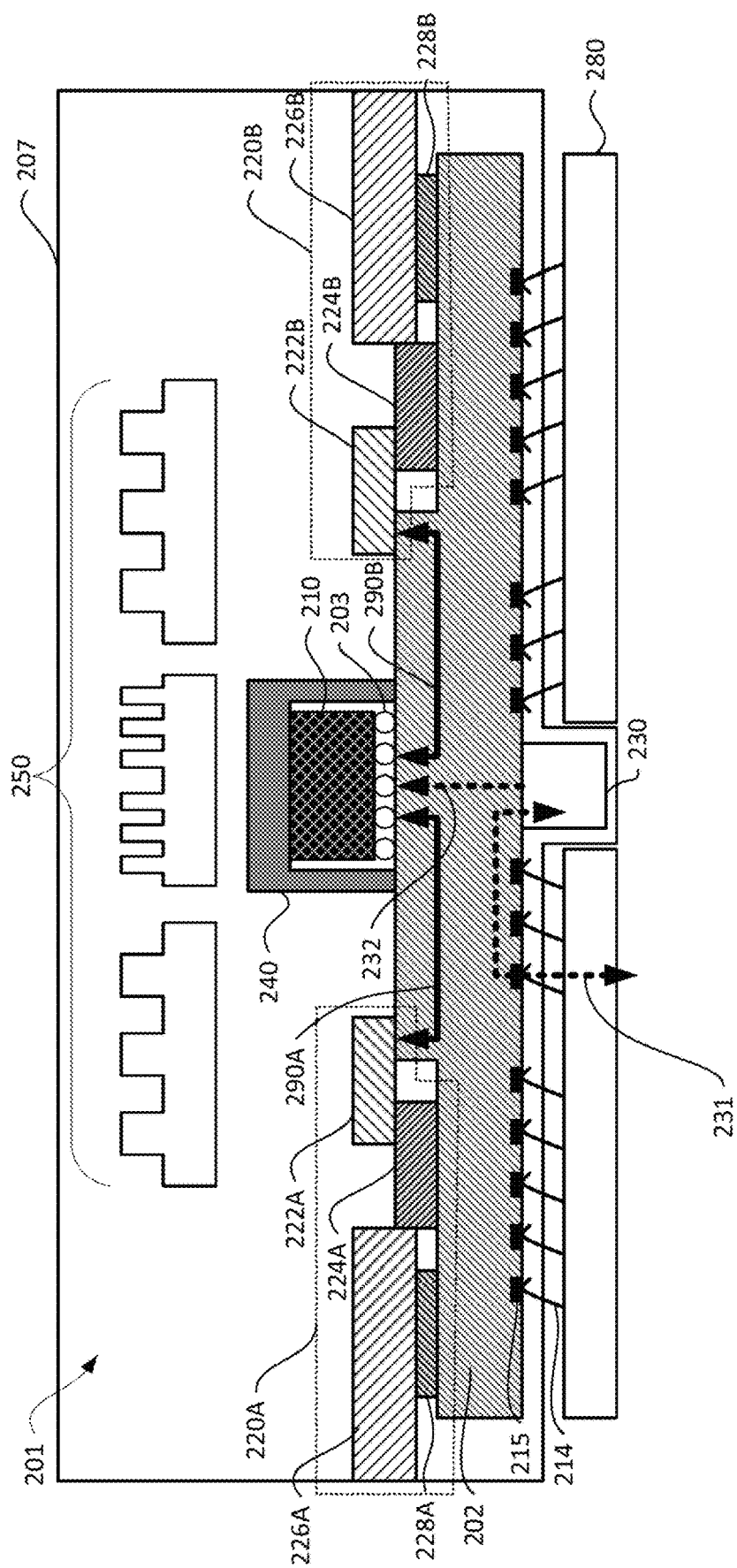
FIG. 2 is a side cut-away view of an ASIC package with an integrated I/O interface and voltage regulator in accordance with aspects of the disclosure.

FIGS. 2-5 illustrate examples of ASIC package configurations with integrated photonic modules. For example, and as shown in FIG. 2, the ASIC package 201 includes an ASIC die 210 mounted to a substrate 202 via a socket 203. The socket may be a ball grid array (BGA), land grid array (LGA), pin grid array (PGA), or other such socket connections. The ASIC package 201 further includes photonic modules, shown as dashed boxes 220A and 220B including fiber arrays 226A, 226B, photonic integrated circuits (PICs) 224A, 224B, and controllers 222A, 222B, which may operate as an I/O system for the ASIC package. The photonic modules 220A and 220B may be attached to a substrate, such as substrate 202 as further shown in FIG. 2. The attachment of the photonic modules 220A and 220B may be either permanent or via a removable connection, as described herein. An interface, such as a serializer/deserializer (SerDes) interface (described herein), shown by the double-sided arrow lines 290A and 290B in FIG. 2, connects the photonic modules 220A and 220B to the ASIC die 210.

The ASIC package 201 may also include a voltage regulator 230 mounted to the opposite side of the substrate 202 where the ASIC die 210 is mounted. Power may be delivered to the ASIC die 210 by the voltage regulator 230, as shown by the dashed-line arrow 232 in FIG. 2. The ASIC package 201 may be configured to connect to a socket, such as LGA socket 280, through which power from an external source, shown by the double-sided dashed arrow 231 may be provided to the voltage regulator 230. The ASIC package 201 may include a housing, such as housing 207 in which the components of the ASIC package 201 are positioned.

A photonic module, such as photonic modules 220A and 220B, may include any number of components including fiber arrays 226A, 226B, photonic integrated circuits (PICs) 224A, 224B, and/or controllers 222A, 222B. The components in a photonic module may be discrete elements and or combinations of elements. For instance, a fiber array may be integrated into a PIC and/or a PIC may be integrated into a controller.

A fiber array, such as fiber arrays 226A and 226B may be a collection of one or more fiber optic cables capable of carrying optical signals into or out of the ASIC package, such as ASIC package 201. The fiber arrays may be one-dimensional (1D) arrays or 2-dimensional (2D) arrays of fiber optic cables. The fiber arrays may be coupled to the PIC via a side or vertical coupling.

The fiber arrays may be mounted onto supports. For example, and as shown in FIG. 2, fiber array 226A is mounted onto support 228A and fiber array 226B is mounted onto support 228B. The supports may attach the fiber arrays to a substrate, such as substrate 202. Depending upon the shape and size of the supports, the physical height and positioning of the fiber arrays may be adjusted. For instance, by increasing the height of a support, such as support 228A, fiber array 226A that is attached to the support may be positioned further from the substrate 202 and higher in the ASIC package 201. In some instances, the supports 228A, 228B may be configured to position the fiber arrays 226A, 226B at particular angles relative to the substrate.

A photonic integrated circuit, such as PICs 224A and 224B may be configured to convert electrical signals into optical signals and/or convert optical signals into electrical signals. For instance, and referring to FIG. 2, the ASIC package 201 includes two photonic modules 220A and 220B, with each photonic module including a PIC, 224A and 224B. The first PIC 224A may be configured to receive optical signals from the attached fiber array 226A and convert the optical signals into electrical signals. The first PIC may then pass the electrical signals to the attached controller 222A. The second PIC 224B may be configured to receive electrical signals from the attached controller 222B and convert the electrical signals to optical signals to be passed out of the ASIC package by the attached fiber array 226B. In some instances, the PICs may include one or more waveguides for guiding optical signals between the PICs and fiber arrays.

A controller may be used to direct the flow of electrical signals between the ASIC die and the PIC. For instance, and as shown in FIG. 2, the ASIC package 201 includes two controllers 222A and 222B. The controllers 222A and 22B may be a trans-impedance amplifier (TIA) and/or integrated circuit (IC) configured to modulate or demodulate signals. For instance, controller 222A may receive a modulated signal from PIC 224A, such as a signal which has been modulated using 4-level pulse amplitude modulation (PAM4) or some other type of modulation. Controller 222A may demodulate the signal and pass it through an interface, such as interface 290A to the ASIC die 210. Controller 222B may receive an unmodulated signal from the ASIC die 210 through interface 290B. The controller 222B may modulate the using PAM4 or some other modulation and pass the modulated signal to PIC 224A. In some instances the controllers may amplify signals or perform other digital signal processing on the signals.

The photonic modules may be connected to the ASIC die via an interface, such as a SerDes interface. For instance, and as shown in FIG. 2, the SerDes interfaces (illustrated by the double sided arrows 290A and 290B) connect the ASIC die 210 to the two photonic modules 220A and 220B. Referring back to FIG. 1, the SerDes interface may include a collection of traces, such as copper traces 291A and 291B, which connect the ASIC die 210 to the photonic modules 220A and 220B. The copper traces 291A and 291B may be printed directly onto the substrate and/or be implemented via wires.

Figure 6:
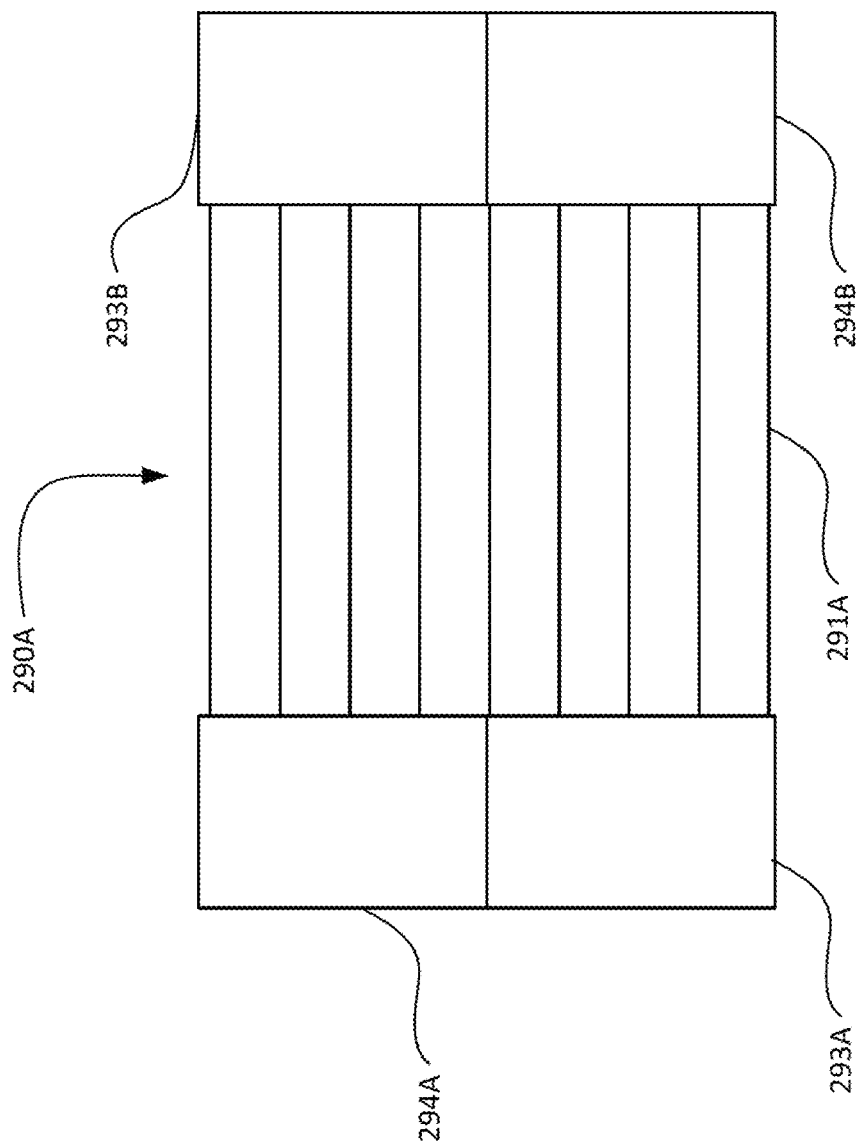
FIG. 6 is an illustration of a serializer/deserializer interface in accordance with aspects of the disclosure.

At each end of the traces of the interface may be a serializer and/or a deserializer which may connect to dies and/or photonic modules. In this regard, each end of the traces may include a serializer and a deserializer to allow for two-way communication over the traces. For instance, and as shown in the exploded view of interface 290A in FIG. 6, serializer 293A on a first end of some of the traces 291A is connected to a deserializer 294B on the opposite side of the traces 291A. Similarly, serializer 293B is found on the opposite side of the traces as deserializer 294A. Although only nine traces are shown in each SerDes interface 290A and 290B, any number of traces may be in an interface. In some instances, the serializers and deserializers may be integrated into the controller and/or ASIC. In some examples, the serializers and deserializers may be integrated into a combined serializer/deserializer.

In operation, serializers 293A, 293B may convert parallel signals into serial signals for transmission over the traces 291A. Deserializers 294A, 294B on the other end of the traces 291A may then convert the serial signals back into parallel signals.

Figure 3:
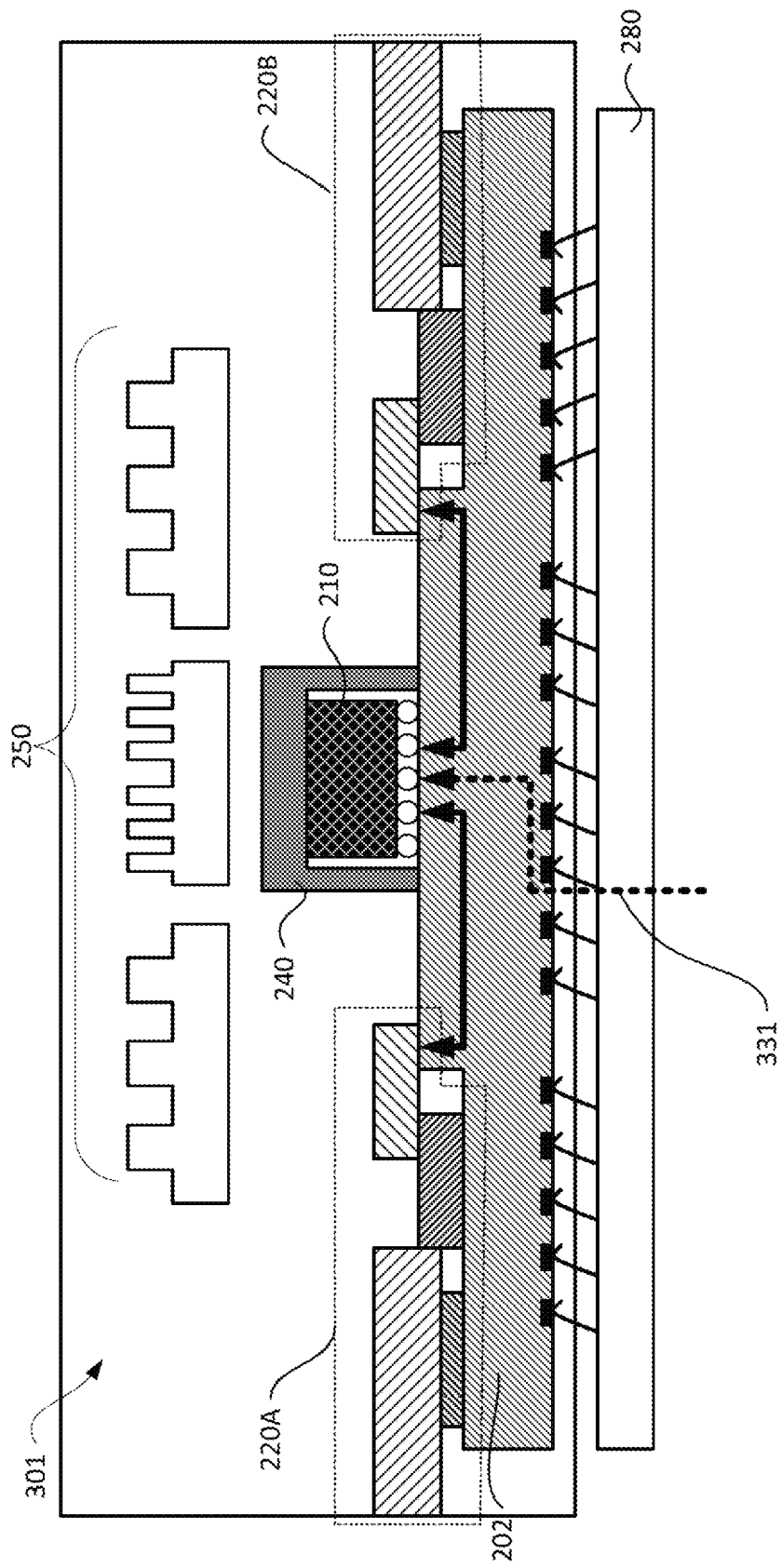
FIG. 3 is a side cut-away view of an ASIC package with an integrated I/O interface in accordance with aspects of the disclosure.

The components of a photonic module may be mounted to the same substrate as the ASIC die and/or a different substrate. For instance, and as shown in FIGS. 2 and 3, the components of the photonic modules 220A, 220B in are mounted to the same substrate as the ASIC die 210—substrate 202. By mounting the photonic modules 220A, 220B to the same substrate as the ASIC die, vertical transitions of the SerDes interfaces 290A, 290B between substrates may be avoided thereby reducing impendence which may cause signal loss.

Figure 4:
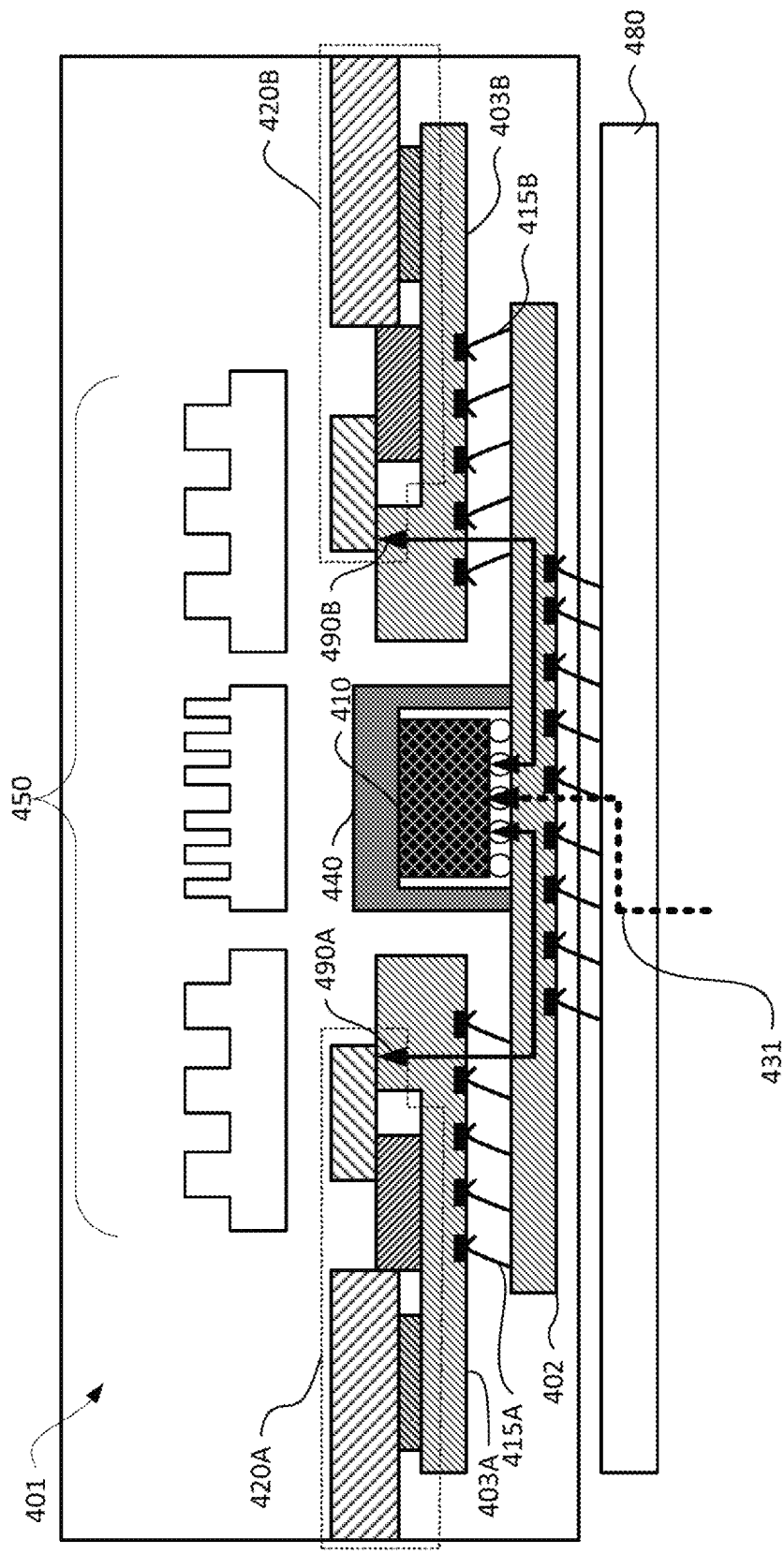
FIG. 4 is a side cut-away view of an ASIC package with an integrated I/O interface on a separate substrate in accordance with aspects of the disclosure.
Figure 5:
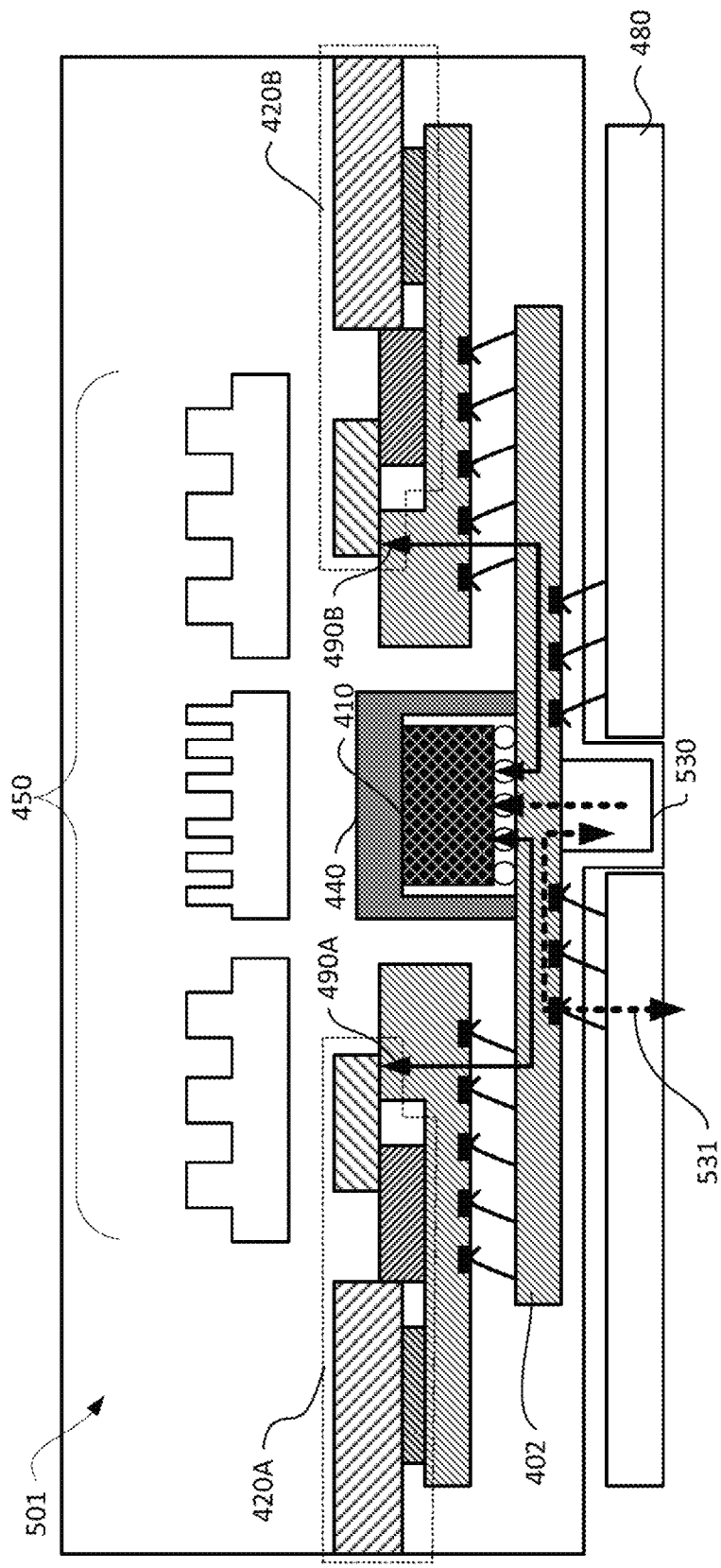
FIG. 5 is a side cut-away view of an ASIC package with an integrated I/O interface on a separate substrate and integrated voltage regulator in accordance with aspects of the disclosure.

In FIGS. 4 and 5, the components of the two photonic modules 420A and 420B, which may be compared to photonic modules 220A, 220B, are mounted to different substrates 403A and 403B, respectively. These two substrates 403A and 403B are each different than the substrate 402 on which the ASIC die 410 is mounted.

As further shown in FIGS. 4 and 5, the substrates 403A and 403B, on which the photonic modules are mounted, may be connected to the substrate 402 on which the ASIC die 410 is mounted. The connection may be formed via a high speed socket and/or soldering, such as socket 415A which connects substrate 403A to substrate 402 and socket 415B which connects substrate 403B to substrate 402. Although FIGS. 4 and 5 shown the photonic modules 420A and 420B being mounted to different substrates 403A and 403B, respectively, the photonic modules 420A and 420B may be mounted on the same substrate. The substrates may be printed circuit boards (PCBs) or other suitable materials.

ASIC packages that have photonic modules on different substrates than the ASIC die may include interfaces which connect the photonic modules to the ASIC die through the substrates. For instance, and as shown in ASIC packages 401 and 501 in FIGS. 4 and 5, respectively, SerDes interfaces, shown by the double arrowed lines 490A and 490B may connect the photonic modules 420A and 420B with ASIC die 410. In this regard, SerDes interface 490A may travel through socket 415A to connect photonic module 420A on substrate 403A with the ASIC die 410 on substrate 402. Similarly, SerDes interface 490B may travel through socket 415B to connect photonic module 420B on substrate 403B with the ASIC die 410 on substrate 402.

By mounting the photonic modules 420A and 420B on different substrates, such as shown in ASIC packages 401 and 501 of FIGS. 4 and 5, the length of the traces in the SerDes interfaces may be longer than when the photonic modules are mounted on the same substrate as the ASIC die, such as shown in ASIC packages 201 and 301 of FIGS. 2 and 3. The increased length of the SerDes interfaces when the photonic modules are on different substrates may increase signal loss as a signal travels the SerDes traces, and travel time of the signal travel time between components may be increased. However, production yield of ASIC packages 401 and 501 may be improved relative to ASIC packages 201 and 301, as broken components (e.g., a broken photonic module, broken ASIC die, etc.,) can be swapped out without a need to replace the entire ASIC package.

Figure 7:
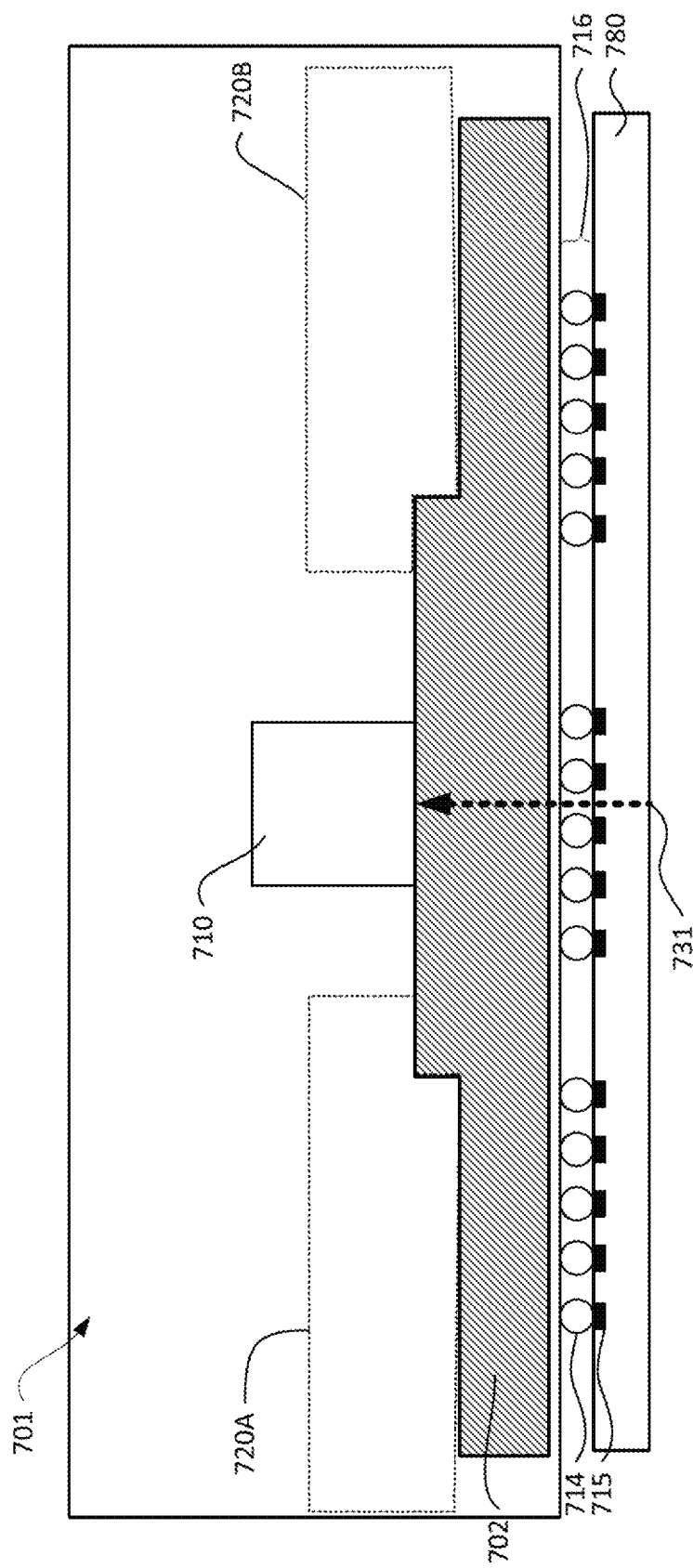
FIG. 7 is a side cut-way view of an ASIC package connected to a substrate via a ball grid array.

Increases in processing speed of an ASIC die, such as ASIC dies 210 and 410, may also increase the amount of power required to operate the ASIC die. In this regard, and as shown in FIG. 7, an ASIC package 701 may be connected to a power source (not shown) via a ball grid array (BGA) 716. The BGA 716 may include a plurality of solder balls, such as solder ball 714, formed on the base of the ASIC package 701. The solder balls may be aligned with corresponding pads, such as copper pad 715, formed on the substrate 780 where the ASIC package 701 is to be mounted. The solder balls are soldered to their corresponding pads to permanently mount the ASIC package 701 to the substrate 780. For instance, solder ball 714 is soldered to corresponding pad 715 to form a solder joint. A power source may deliver power to the ASIC die 710, and in some instances, photonic modules 720A and 720B, through solder joints of the BGA 716 and wires and/or other such connections (not shown) within the substrate 702, as illustrated by dashed arrow 731.

An increase in power drawn by an ASIC die 710 may result in an increase of heat within the ASIC package due to copper losses generated by the wires and/or other such connections which carry the power through the ASIC package 710 and substrate 702 to the ASIC die 710. Copper losses, also known as "$I^2R$ losses" (where 'I' is the current flowing through the copper in wiring and 'R' is the resistance of the wiring), is the amount of heat dissipated as current passes through wiring. The increase in temperature generated by the increased power draw of the ASIC die 710 may result in BGA solder electromigration and potential failure of one or more solder joints. The increase of temperature may also affect the thermal performance of the ASIC die 710, potentially leading failure of the ASIC die 710 or other components of the ASIC package 701.

To reduce the amount of copper losses generated by wires, planes (e.g., copper planes), and/or other such connections which carry the power through the ASIC package to the ASIC die, a voltage regulator may be integrated into the ASIC package. For example, a voltage regulator 230 is mounted to the opposite side of substrate 202 where ASIC die 210 is mounted, as shown in ASIC package 201 of FIG. 2. And as shown in ASIC package 501 of FIG. 5, a voltage regulator 530 is mounted to the opposite side of the substrate 402 where the ASIC die 410 is mounted. Power may be delivered to the voltage regulator 230, 530 from an external power source. In this regard, the external power source may provide power to the voltage regulator 230, 530 through a socket to which the ASIC package is mounted, as shown by the dashed double-sided arrows 231 and 531 in FIGS. 2 and 5, respectively. The voltage regulator 230, 530 may then provide power to the ASIC die 210, 410 via one or more wires, planes (e.g., copper planes,) and/or other such connections on or within the substrate.

The voltage regulator may maintain a consistent power draw from the external power source, thereby preventing or reducing the number of increases in power carried by the wires, traces, and/or other such connections on or within the substrate. Moreover, the length of the wires, traces, and/or other such connections between the voltage regulator and the ASIC die, such as ASIC dies 210 and 410, may be reduced relative to when power is received by the ASIC dies 210 and 410 directly from the external power source, as shown by the dashed arrows 331 and 431 in FIGS. 3 and 4, respectively. As socket contacts on the ASIC package, such as contacts 215 of ASIC package 201, typically have high contact resistance, heat loss generated by power flowing through the contact 215 may be significant. By moving the voltage regulator into the ASIC package, the amount of power flowing through the contacts 215 may be reduced. Thus, the heat within the ASIC packages 201 and 501 generated by copper losses may be reduced. Although voltage regulators 230 and 5330 are shown as being directly underneath the ASIC dies 210 and 410, the voltage regulators may be offset from the ASIC dies.

Heat may be further reduced through the use of heatsinks and heat spreaders. For instance, and as shown in FIGS. 2 and 3, heat spreader 240 may be positioned around ASIC dies 210 to pull the heat generated by the ASIC die 210 away from the ASIC die 210. Similarly, heat spreader 440 may be positioned around ASIC dies 410 to pull the heat generated by the ASIC die 410 away from the ASIC die 410.

Heat sinks may be positioned within the interior of the ASIC package to pull the heat from the interior of the package, such as heat generated by the photonic module and ASIC die, and push it towards the housing of the ASIC package. For instance, and as shown in FIGS. 2 and 3, heat sink 250 may be positioned above ASIC die 210 and heat spreader 240. The heat sink 250 may pull heat from the ASIC die 210 and heat spreader 240. Similarly, heat sink 450 may pull heat from the ASIC die 410 and heat spreader 440.

As discussed above, a typical ASIC package may be connected to a power source via pins soldered onto a ball grid array (BGA). However, given the larger size of an ASIC package having integrated photonic modules and/or voltage regulators, an LGA socket, as LGA sockets 280 and 480 FIGS. 2-5 may be used. Referring to FIG. 2, LGA socket 280 may include pins 214 which align with contacts 215 formed on substrate 202. When the ASIC package 201 is arranged such that the contacts 215 align with pins 214, the ASIC package 201 may be secured to the LGA socket 280. In some instances, the pins 214 may be soldered to the contacts 215. However, the pins 214 may provide sufficient contact with the contacts 215 of the ASIC package to reduce the need for solder joints and thereby the risk for solder electromigration. In lieu of, or in addition to soldering, a latch or other such locking component may maintain the ASIC package 201 secure in the LGA socket 280. In instances where the ASIC package 201 is not soldered to the LGA socket 280, the ASIC package 201 may be removable from the LGA socket 280.

Although the example ASIC packages 201, 301, 401, and 501 shown in FIGS. 2-5 include only a single ASIC die 210 or 410, each ASIC package may include any number of ASIC dies. Moreover, each ASIC package may include any number of photonic modules, components within the photonic modules, voltage regulators, or other components. Additionally, although the packages described herein are described as ASIC packages having ASIC dies, any type of die may be used, such as an integrated circuit die.

The features described herein allow for the integration of photonic modules into an ASIC package. By doing such, I/O system bottlenecks may be reduced or removed. Further, signal loss over the connection interface between the photonics module and ASIC die may be reduced. Additionally, by integrating a voltage regulator into the ASIC package, the copper losses generated by wires, traces, and/or other such connections which carry the power through the ASIC package to the ASIC die may be reduced. Configuring the ASIC package to mount to a LGA socket may reduce the risk of broken solder joints and, solder electromigration, as well as provide the ability to remove the ASIC package as needed.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An integrated circuit (IC) package comprising:
   a first substrate;
   one or more additional substrates;
   an IC die mounted to a first surface of the first substrate;
   one or more photonic modules, wherein each of the one or more photonic modules are mounted to at least one of the one or more additional substrates; and
   a voltage regulator mounted on a second surface of the first substrate directly under the IC die, wherein the second surface of the first substrate is opposite the first surface of the first substrate.

2. The IC package of claim 1, further comprising:
   one or more serializer/deserializer (SerDes) interfaces directly connecting the IC die to the one or more photonic modules.

3. The IC package of claim 2, wherein the one or more SerDes interfaces include a plurality of copper traces; and
   wherein the plurality of copper traces are deposited on the first substrate.

4. The IC package of claim 3, wherein each of the one or more SerDes interfaces includes a first side and a second, opposite side,
   wherein for each of the one or more SerDes interfaces, the first side connects to a respective one of the one or more photonic modules and the second, opposite side connects to the IC die.

5. The IC package of claim 1, wherein each of the one or more photonic modules includes a controller, wherein each controller manages transmission of data between its respective photonic module and the IC die.

6. The IC package of claim 5, wherein each of the one or more photonic modules further include a photonic integrated circuit (PIC) and fiber array.

7. The IC package of claim 1, wherein the IC package is configured to connect to a land grid array (LGA) socket.

8. The IC package of claim 7, wherein power is delivered to the IC package via the LGA socket.

9. The IC package of claim 1, wherein each of the one or more additional substrates are attached to the first substrate via one or more sockets.

10. The IC package of claim 1, wherein each of the one or more additional substrates are removably mounted.

11. An application specific integrated circuit (ASIC) package comprising:
    a first substrate;
    one or more additional substrates;
    an ASIC die mounted to a first surface of the first substrate;
    one or more photonic modules, wherein each of the one or more photonic modules are mounted to at least one of the one or more additional substrates; and
    a voltage regulator mounted on a second surface of the first substrate directly under the ASIC die, wherein the second surface of the first substrate is opposite the first surface of the first substrate.

12. The ASIC package of claim 11, further comprising:
one or more serializer/deserializer (SerDes) interfaces directly connecting the ASIC die to the one or more photonic modules.

13. The ASIC package of claim 12, wherein the one or more SerDes interfaces include a plurality of copper traces; and
wherein the plurality of copper traces are deposited on the first substrate.

14. The ASIC package of claim 13, wherein each of the one or more SerDes interfaces includes a first side and a second, opposite side,
wherein for each of the one or more SerDes interfaces, the first side connects to a respective one of the one or more photonic modules and the second, opposite side connects to the ASIC die.

15. The ASIC package of claim 11, herein each of the one or more photonic modules includes a controller, wherein each controller manages transmission of data between its respective photonic module and the ASIC die.

16. The ASIC package of claim 15, wherein each of the one or more photonic modules further include a photonic integrated circuit (PIC) and fiber array.

17. The ASIC package of claim 11, wherein the ASIC package is configured to connect to a land grid array (LGA) socket.

18. The ASIC package of claim 17, wherein power is delivered to the voltage regulator via the LGA socket.

19. The ASIC package of claim 11, wherein each of the one or more additional substrates are attached to the first substrate via one or more sockets.

20. The ASIC package of claim 11, wherein each of the one or more additional substrates are removably mounted.

\* \* \* \* \*